(12) United States Patent
Biener et al.

(10) Patent No.: US 11,959,183 B2
(45) Date of Patent: Apr. 16, 2024

(54) DILUTE ALLOY CATALYSTS FOR ELECTROCHEMICAL CO2 REDUCTION

(71) Applicant: Lawrence Livermore National Security, LLC, Livermore, CA (US)

(72) Inventors: Juergen Biener, San Leandro, CA (US); Sneha Akhade, Oakland, CA (US); Monika Biener, San Leandro, CA (US); Zhen Qi, Tracy, CA (US); Joel Varley, Livermore, CA (US); Stephen Weitzner, Livermore, CA (US); Vedasri Vedharathinam, Fremont, CA (US)

(73) Assignee: Lawrence Livermore National Security, LLC, Livermore, CA (US)

(*) Notice: Subject to any disclaimer, the term of this patent is extended or adjusted under 35 U.S.C. 154(b) by 583 days.

(21) Appl. No.: 17/061,165

(22) Filed: Oct. 1, 2020

(65) Prior Publication Data

US 2021/0147989 A1 May 20, 2021

Related U.S. Application Data

(60) Provisional application No. 62/936,110, filed on Nov. 15, 2019.

(51) Int. Cl.
*C25B 11/081* (2021.01)
*B05D 1/02* (2006.01)
(Continued)

(52) U.S. Cl.
CPC .............. *C25B 11/081* (2021.01); *B05D 1/02* (2013.01); *C22C 9/01* (2013.01); *C22C 9/02* (2013.01);
(Continued)

(58) Field of Classification Search
CPC .......... C25B 11/081; C25B 1/00; C25B 3/58; B05D 1/02; C22C 9/01; C22C 9/02;
(Continued)

(56) References Cited

U.S. PATENT DOCUMENTS

| 5,559,065 A | 9/1996 | Lauth et al. |
| 2007/0160899 A1 | 7/2007 | Atanassova et al. |

(Continued)

FOREIGN PATENT DOCUMENTS

| JP | 2018031034 A | * | 3/2018 |
| WO | 2014033204 A1 | | 3/2014 |

(Continued)

OTHER PUBLICATIONS

International Search Report and Written Opinion from PCT Application No. PCT/US 20/54862, dated Feb. 11, 2021.

(Continued)

*Primary Examiner* — James A Fiorito
(74) *Attorney, Agent, or Firm* — Zilka-Kotab, P.C.

(57) ABSTRACT

A product includes a dilute alloy catalyst for carbon dioxide reduction. The catalyst has a majority component and at least one minority component. The majority component is present in a concentration of greater than 90 atomic percent of the catalyst. The majority component is copper, and each minority component is selected from the group consisting of: a transition metal, a main group metal, a lanthanide, and a semimetal. A method includes forming a product on a cathode. The product includes a dilute alloy catalyst for carbon dioxide reduction. The catalyst has a majority component and at least one minority component. The majority component is present in a concentration of greater than 90 atomic percent of the catalyst. The majority component is copper, and each minority component is selected from the (Continued)

group consisting of: a transition metal, a main group metal, a lanthanide, and a semimetal.

21 Claims, 8 Drawing Sheets

(51) Int. Cl.
| | |
|---|---|
| C22C 9/01 | (2006.01) |
| C22C 9/02 | (2006.01) |
| C22C 9/04 | (2006.01) |
| C23C 14/14 | (2006.01) |
| C23C 14/30 | (2006.01) |
| C23C 14/35 | (2006.01) |
| C25B 1/00 | (2021.01) |
| C25D 3/58 | (2006.01) |

(52) U.S. Cl.
CPC ............. *C22C 9/04* (2013.01); *C23C 14/14* (2013.01); *C23C 14/30* (2013.01); *C23C 14/35* (2013.01); *C25B 1/00* (2013.01); *C25D 3/58* (2013.01)

(58) Field of Classification Search
CPC ........... C22C 9/04; C23C 14/14; C23C 14/30; C23C 14/35
See application file for complete search history.

(56) References Cited

U.S. PATENT DOCUMENTS

| | | |
|---|---|---|
| 2007/0212594 A1 | 9/2007 | Takasu et al. |
| 2012/0046161 A1 | 2/2012 | Ball et al. |
| 2019/0062929 A1 | 2/2019 | Shin et al. |

FOREIGN PATENT DOCUMENTS

| | | |
|---|---|---|
| WO | 2014174065 A1 | 10/2014 |
| WO | 2017062788 A1 | 4/2017 |

OTHER PUBLICATIONS

Numprasanthai, A., "Binary Skeletal Copper-Cobalt Catalysts," Thesis, School of Chemical Sciences and Engineering, The University of New South Wales, Jun. 2009, 173 pages.
Shan et al., "Selective non-oxidative dehydrogenation of ethanol to acetaldehyde and hydrogen on highly dilute NiCu alloys," Applied Catalysis B: Environmental, vol. 205, 2017, pp. 541-550.
Giannakakis et al., "NiAu Single Atom Alloys for the Non-oxidative Dehydrogenation of Ethanol to Acetaldehyde and Hydrogen," Topics in Catalysis, vol. 61, Mar. 19, 2018, pp. 475-486.
Zhong et al., "Accelerated discovery of $CO_2$ electrocatalysts using active machine learning," Nature, vol. 581, May 14, 2020, pp. 178-183.
Saw et al., U.S. Appl. No. 16/994,324, filed Aug. 14, 2020.

* cited by examiner

| Alloy element | ε(kcal mol⁻¹) | σ(Å) |
|---|---|---|
| Cu | 1.000 | 3.000 |
| Ag | 0.036 | 2.804 |
| Al | 0.070 | 2.500 |
| Au | 0.039 | 2.932 |
| B | 0.050 | 3.600 |
| Ga | 0.415 | 3.905 |
| In | 0.599 | 3.976 |
| Pb | 0.191 | 3.000 |
| Pd | 0.048 | 2.582 |
| Pt | 1.660 | 2.650 |
| Sn | 0.567 | 3.913 |

DILUTE ALLOY CATALYSTS FOR ELECTROCHEMICAL CO2 REDUCTION

RELATED APPLICATIONS

This application claims priority to U.S. Provisional Patent Application No. 62/936,110 filed Nov. 15, 2019, which is herein incorporated by reference.

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to electrochemical conversion and more particularly, this invention relates to catalysts for electrochemical conversion.

BACKGROUND

One promising approach to meeting the nation's future energy needs is focused on converting $CO_2$, an industrial waste product, into methane and other versatile fuels that can be readily integrated into efforts to fuel vehicles, power plants and industrial chemical process lines, etc. At the same time, Power-to-Gas (PtG) technology can convert excess electrical energy produced by renewable energy resources, such as solar and wind, into chemical energy, thus providing a pathway for seasonal electric energy storage. A key obstacle for deployment of one-step electrochemical PtG technology and electrosynthesis in general is the development of low-cost electrocatalysts that facilitate energy-efficient production of methane or other hydrocarbons from $CO_2$ with high selectivity and long-term stability. Scaling relationships describe the relative stabilities of reaction intermediates of rate limiting steps and are often closely coupled due to similarities in their binding chemistry. These scaling relationships limit the ability to manipulate the reactivity and selectivity by using pure transition metals or traditional transition metal alloys. It is thus necessary to develop new approaches that allow one to break these scaling relationships.

SUMMARY

A product, according to one embodiment, includes a dilute alloy catalyst for carbon dioxide reduction. The catalyst has a majority component and at least one minority component. The majority component is present in a concentration of greater than 90 atomic percent of the catalyst. The majority component is copper, and each minority component is selected from the group consisting of: a transition metal, a main group metal, a lanthanide, and a semimetal.

A method, according to another embodiment, includes forming a product on a cathode. The product includes a dilute alloy catalyst for carbon dioxide reduction. The catalyst has a majority component and at least one minority component. The majority component is present in a concentration of greater than 90 atomic percent of the catalyst. The majority component is copper, and each minority component is selected from the group consisting of: a transition metal, a main group metal, a lanthanide, and a semimetal.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 3 is a table of the Lennard-Jones interaction parameters used for explicit metal atoms present in the quantum mechanical portion of the simulation cell, according to one aspect of the presently disclosed inventive concepts.

DETAILED DESCRIPTION

Figure 1:
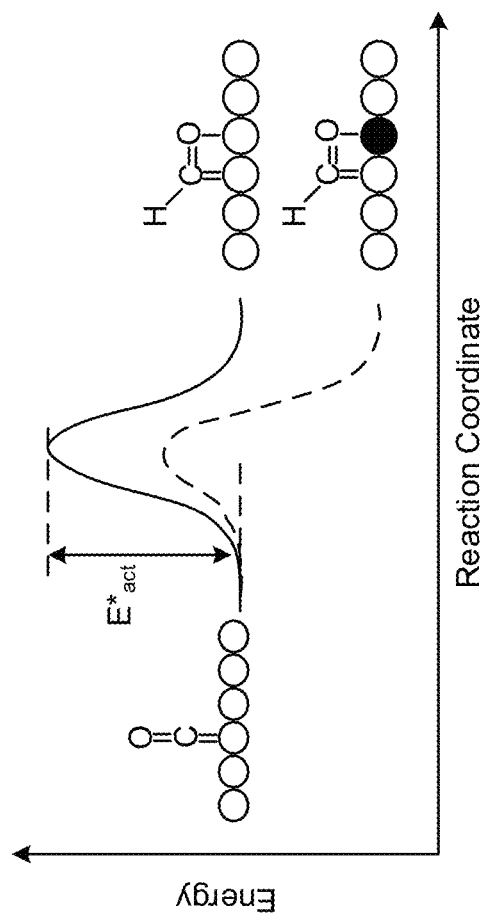
FIG. 1 is a schematic reaction coordinate diagram for a dilute alloy electrocatalyst for modifying the relative height of the activation barriers for the selectivity-determining reaction steps, according to one aspect of the presently disclosed inventive concepts.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. The term "about" as used herein indicates the value preceded by the term "about," along with any values reasonably close to the value preceded by the term "about," as would be understood by one of skill in the art. When not indicated otherwise, the term "about" denotes the value preceded by the term "about"±10% of the value. For example, "about 10" indicates all values from and including 9.0 to 11.0.

The following description discloses several preferred embodiments of dilute Cu-based alloy catalysts for electrochemical conversion of carbon dioxide to versatile fuels and/or related systems and methods.

In one general embodiment, a product includes a dilute alloy catalyst for carbon dioxide reduction. The catalyst has a majority component and at least one minority component. The majority component is present in a concentration of greater than 90 atomic percent of the catalyst. The majority component is copper, and each minority component is selected from the group consisting of: a transition metal, a main group metal, a lanthanide, and a semimetal.

In another general embodiment, a method includes forming a product on a cathode. The product includes a dilute alloy catalyst for carbon dioxide reduction. The catalyst has a majority component and at least one minority component. The majority component is present in a concentration of greater than 90 atomic percent of the catalyst. The majority component is copper, and each minority component is selected from the group consisting of: a transition metal, a main group metal, a lanthanide, and a semimetal.

Ensuring energy security requires new technologies for distributed fuel and chemical manufacturing. Development of new catalysts using low-cost, earth-abundant materials will be critical for this endeavor. A conventional catalyst for power-to-gas conversion is copper (Cu). Copper-based catalysts are used in several industrial fuel and chemical production processes, including the water-gas shift reaction, dehydrogenation of alcohols, and production of methanol. Copper may also be a promising replacement for other noble metal catalysts. One such hydrocarbon production process that is attractive for energy grid storage is the electrochemical reduction of $CO_2$ to methane. This reaction is an example of "power-to-gas," which enables long-term storage of excess renewable electricity in the form of fuel (e.g., methane, ethylene, CO, ethanol, formic acid, hydrogen, etc.) or various feedstock chemicals for the chemical industry.

Methane can serve as a high-capacity energy carrier that can be stored or transported using mature technologies and immediately integrated into existing infrastructure. However, current power-to-gas technologies are highly energy intensive. An enduring obstacle for deployment of a direct power-to-gas technology is the development of catalysts that facilitate energy efficient production of methane (or other high capacity energy carrier chemicals) from $CO_2$ with high selectivity and long-term stability. Various embodiments of the present disclosure address this technology gap with the development of copper-based dilute alloy catalysts to improve selectivity and energy efficiency of the power-to-gas conversion. A dilute alloy as referred to throughout the present disclosure may refer to an alloy having a relatively low concentration of a solute (e.g., the minority component) element homogeneously distributed throughout the alloy with a different metallic element (e.g., the majority component, copper) as would become apparent to one having ordinary skill in the art in view of the present disclosure.

A key obstacle for commercial deployment of one-step electrochemical $CO_2$-to-fuel conversion is the non-existence of low-cost electrocatalysts that facilitate energy-efficient production of methane or other hydrocarbons from $CO_2$ combined with high selectivity and long-term stability. The ability to improve catalyst reactivity and selectivity by changing the morphology using other non-copper transition metals or traditional alloy catalysts is limited as the relative stabilities of the rate limiting reaction intermediates are often closely coupled due to similarities in their binding chemistry (e.g., based on scaling relationships). Dilute alloys as presented herein allow for tuning of the rates of $CO_2$-to-hydrocarbon reduction and hydrogen evolution.

Various aspects of the present disclosure provide a comparison of experimental electrochemical rates for $CO_2$-to-CO reduction and hydrogen evolution with theoretically computed binding energies (BE) which reveals alloys that weakly bind CO and H help promote $CO_2$-to-fuel reduction and suppress $H_2$ evolution. In some aspects, strongly CO binding transition metal alloys (CuPd, CuNi, CuPt) lead to poorer C1/C2 reduction selectivity relative to Cu. By contrast, CuAg, CuAu and CuAl improve reactivity and selectivity of CO reduction compared to pure Cu. The inventors have discovered that, based on calculated reaction energies of CO dimerization on various Cu based dilute alloy catalysts, the relative stabilities of the rate limiting reaction intermediates on dilute alloy catalysts are no longer closely coupled, thus breaking the scaling relationships that limit the ability to improve catalyst reactivity and selectivity by changing the morphology or composition of traditional metal and metal alloy catalysts. Specifically, experimental data showed dilute alloying copper with aluminum makes CO dimerization considerably more energetically favorable by up to 0.4 eV under reducing conditions than pure Cu.

Various embodiments of the present disclosure include catalysts that break the expected scaling relationships of reaction intermediates by providing Cu-based dilute alloy catalysts with less than 10% of the minority alloy component(s). The presently disclosed dilute Cu-based alloys have been demonstrated to improve the energy efficiency and selectivity of the PtG conversion. The development of these catalysts was made possible by establishing a theory-based rational design platform for dilute alloy transition metal electrocatalysts.

In various approaches, the dilute alloy catalysts may be integrated into electrolyzer systems known in the art for use in PtG conversion using different catalyst coating techniques, including, but not limited to, magnetron sputtering, electron-beam evaporation, printing, ink-jetting, etc. In some approaches, the inks for the printing and/or ink-jetting approach may include alloy particles prepared using a recently developed scalable ball milling method to generate the required gram-quantities of submicrometer-sized dilute single phase alloy particles, as discussed in more detail below.

Copper catalysts have been shown to produce an array of organic compounds including hydrocarbons. Various aspects described herein increase Cu's selectivity to a single product and to increase Cu's energy efficiency. Understanding the fundamental behavior of Cu and how it interacts within an electrochemical cell is the key to improving its performance.

Alloying changes the surface electronic properties of the electrocatalyst and leads to a variation in its chemical interaction with $CO_2$ reaction intermediates. This alters the binding energies of key reaction intermediates which in turn alters reaction activity and selectivity. Dilute alloys allow individual tuning of the rates of $CO_2$-to-CO reduction and the competing hydrogen evolution. Dilute alloys also allow individual tuning of the rates of CO dimerization towards ethylene and other C2 products and CO hydrogenation towards methane.

FIG. 1 is a schematic reaction coordinate diagram for a dilute alloy electrocatalyst demonstrating the control over reactivity and selectivity of $CO_2$ reduction by selectively facilitating the hydrogenation of the carbon atom of CO vs.

hydrogenation of the oxygen atom, thus modifying the relative height of the activation barriers for these selectivity-determining reaction steps.

High surface area nanoporous Cu and dilute Cu alloy catalysts can be synthesized in a highly controlled manner. In some approaches, the Cu and dilute Cu alloy catalysts may be 3D printed while retaining functionality. Various Cu catalyst and process design parameters include: the alloying element, catalyst structure and morphology, surface orientation, electrolyte, bias potential, etc.

For example, and without wishing to be bound by any theory, for $CO_2$ reduction to $CH_4$, the rate limiting step is believed to be the protonation of the intermediate CO to CHO. As described herein, the Cu catalyst is alloyed with an element (e.g., a minority component) that has a higher oxygen affinity than Cu, thus increasing the stability of the product of the rate limiting step, CHO, without affecting the stability of the CO intermediate. Using control over composition, the activation barrier of this transformation may be reduced as shown in FIG. 1. The activation barrier may be reduced by creating dilute alloy catalysts where the majority component (Cu) shows low reactivity for the hydrogen evolution reaction because of its high activation barrier toward hydrogen recombination, and the minority component provides high affinity binding sites for oxygen. The choice of the minority component, in combination with the structure and orientation of the Cu, enables tunable efficiency and selectivity of the dilute Cu-based catalyst. Another consideration when selecting the catalyst composition may include the chemistry of the electrochemical interface of the minority component with the catalyst, which is primarily controlled by the solvent and its additives. The electrolyte affects the interfacial field strength associated with the electrical double layer (EDL), and the energetics of intermediate species may be adjusted to alter the available kinetic pathways. Advanced simulations may provide further guidance for development in solid and liquid engineering.

In some approaches, a method includes forming on a cathode, a product for carbon dioxide reduction. The product preferably includes a dilute alloy catalyst for carbon dioxide reduction having a majority component and at least one minority component according to any aspect described herein. The majority component is present in a concentration of greater than 90 atomic percent of the catalysts in preferred approaches. The majority component is copper.

In various approaches, each minority component is a transition metal, a main group metal, a semimetal, or a lanthanide (rare earth elements), etc. Transition metals include scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), platinum (Pt), gold (Au), and mercury (Hg). Semimetals include boron (B), silicon (Si), germanium (Ge), arsenic (As) and antimony (Sb). Lanthanides include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). In preferred approaches, at least one of the at least one minority components is selected from gold and silver. For example, the dilute alloy catalyst may comprise gold wherein gold is present in a concentration of about 5 atomic percent.

In other approaches, each minority component is a main group metal or a semimetal including aluminum (Al), gallium (Ga), indium (In), tin (Sn), thallium (Tl), lead (Pb), bismuth (Bi), etc., or any other main group metal or semimetal. In one preferred approach, at least one minority component includes aluminum in a concentration of about 0.1 atomic percent to less than about 10 atomic percent of the catalyst. In another approach, the dilute alloy may be made by selective leaching of the less noble component of an intermetallic compound such as $CuAl_2$. In other approaches, the dilute alloy may include CuAl where aluminum is present in a concentration of about 5 atomic percent of the catalyst. In a preferred approach, the dilute alloy may include CuAl where aluminum is present in a concentration of less than 4 atomic percent.

In some approaches, the at least one minority component is present in a concentration of less than about 6 atomic percent of the catalyst. For example, the at least one minority component may include nickel which is present in a concentration of about 6 atomic percent of the catalyst.

The minority components may include any combination of transition metals, main group metals, semimetals, or lanthanides (rare earth elements), etc., as would become apparent by one having ordinary skill in the art upon reading the present disclosure. For example, the dilute Cu-based alloy may include a plurality of minority components wherein at least one of the minority components is a transition metal and at least one other of the minority components is a main group metal. In one approach, the at least one minority component includes boron. For example, the catalyst may comprise boron wherein boron is present in a concentration of about 5 atomic percent of the catalyst.

In various aspects, a dilute alloy catalyst may comprise at least two minority components wherein the total of the combination of the at least two minority components is present in a concentration of less than about 10 atomic percent of the catalyst. For example, the dilute alloy catalyst may include about 90 atomic percent or more copper and about 10 atomic percent or less of the catalyst may include a combination of gold and silver. In other aspects, a dilute alloy catalyst may comprise at least three minority components wherein the total of the combination of the at least three minority components is present in a concentration of less than about 10 atomic percent. In some approaches, the minority components may be present in equal concentrations. In other approaches, the minority components may be present in different concentrations. For example, minority components may be in any ratio between 1:1 and 1:10 of minority components of a ternary alloy.

In some approaches, exemplary dilute alloys may comprise combinations of any of the following minority components present in the concentration of the associated atomic percent. For example, the catalyst may comprise magnesium wherein magnesium is present in a concentration of about 5 atomic percent or less of the catalyst. In another example, the catalyst may comprise calcium wherein calcium is present in a concentration of about 5 atomic percent or less of the catalyst. In yet another example, the catalyst may comprise titanium wherein titanium is present in a concentration of about 5 atomic percent or less of the catalyst. In yet another example, the catalyst may comprise tin wherein tin is present in a concentration of about 5 atomic percent or less of the catalyst. In yet another example, the catalyst may comprise indium wherein indium is present in a concentration of about 5 atomic percent or less of the catalyst. In one example, the catalyst may comprise gallium wherein gallium is present in a concentration of about 5 atomic percent or less of the catalyst. In a further example, the catalyst may comprise zinc wherein zinc is present in a concentration of about 5 atomic percent or less of the catalyst. Similarly, any of these components may be present at greater than about 5 atomic percent and any other minority component is present such that the total atomic percentage of minority components in the catalyst is less than about 10 atomic percent of the catalyst.

In preferred aspects, the minority component is in substantially the same concentration throughout the dilute alloy catalyst. For example, the minority component may be present in substantially the same concentration throughout the dilute alloy catalyst with substantially no clusters of aggregated minority component material, as would be understood by one having ordinary skill in the art upon reading the present disclosure.

In preferred aspects, the catalyst is configured to catalyze the reduction of carbon dioxide to methane. In other preferred aspects, the catalyst is configured to catalyze the reduction of carbon dioxide to ethylene. The catalyst may be configured to catalyze the reduction of carbon dioxide to any hydrocarbon and/or versatile fuel known in the art, as would become apparent to one having ordinary skill in the art in view of the present disclosure.

The dilute Cu-based alloy formed on the cathode is a single phase alloy of the components. The single phase alloy may be physically characterized by formation by ball milling as described in various aspects of U.S. patent application Ser. No. 16/994,324 filed Aug. 14, 2020, which is herein incorporated by reference. In brief, ball milling techniques may include using high energy ball milling (e.g., mechanical alloying) to form alloys which are physically characterized by remaining substantially in the single face center cubic (FCC) phase, hexagonal close-packed (HCP) phase, or body centered cubic (BCC) phase. The ball milling techniques may result in a product comprising the alloy in the form of single phase nanoparticles.

In another aspect, the dilute Cu-based alloy catalyst may be formed by melt processing the majority component and the at least one minority component, using a technique that would become apparent to one having ordinary skill in the art upon reading the present disclosure.

In various aspects, a product comprising the dilute alloy catalyst is porous, where at least 50% of the catalyst by volume is void space. In some approaches, the product comprising the dilute alloy catalyst is porous, where at least 60% of the catalyst by volume is void space. For example, the dilute alloy catalyst may be porous up to the point below which the catalyst is no longer self-supporting and/or below which the catalyst would collapse on itself as would become apparent to one having ordinary skill in the art upon reading the present disclosure.

The method of forming the dilute Cu-based alloy catalyst on the cathode may include coupling the alloy to the cathode in any manner known in the art. The cathode may be any conductive substrate. In a preferred aspect, a cathode for use in a gas diffusion electrolyzer may be any porous conductive substrate known in the art. In various aspects, the cathode is a porous carbon structure. The wetting behavior (hydrophilic or hydrophobic) of the porous substrate may be modified by applying appropriate surface modifications as would become apparent to one having ordinary skill in the art upon reading the present disclosure.

In some aspects, the method of forming the dilute Cu-based alloy catalyst on the cathode includes producing particles of the dilute alloy catalyst and applying the particles to surface of the cathode. In preferred aspects, the method of forming the dilute Cu-based alloy catalyst on the cathode includes producing submicrometer-sized (e.g., in some approaches, nanoparticles prepared according to the ball milling techniques described above) dilute alloy particles. The dilute alloy particles may be applied via incorporation in an ink and applied to the cathode using ink jetting applications known in the art as would become apparent to one having ordinary skill in the art in view of the present disclosure. In other approaches, the dilute alloy particles may be applied to the cathode by various means including, but not limited to, spray coating, 3D printing, painting, etc.

In other approaches, the method for forming the dilute Cu-based alloy catalyst on the cathode may include applying a relatively thin coating of the selected catalyst alloy directly to the surface of the cathode. The coating of the catalyst alloy may be a thickness between about 10 nm and about 10 microns. In various aspects, the thickness is between about 100 nm and about 1 micron. In one preferred aspect, the thickness is between about 400 nm and about 800 nm. The thin coating may be applied directly to the cathode by magnetron sputtering, e-beam evaporation, ink jetting, electrodeposition, etc., using techniques that would become apparent to one having ordinary skill in the art in view of the present disclosure.

In any approach, a sacrificial material, e.g., carrier, ink base, solvent, etc. that assists in applying the dilute Cu-based alloy catalyst on the cathode may be removed using known techniques to expose the catalyst known in the art.

Figure 2:
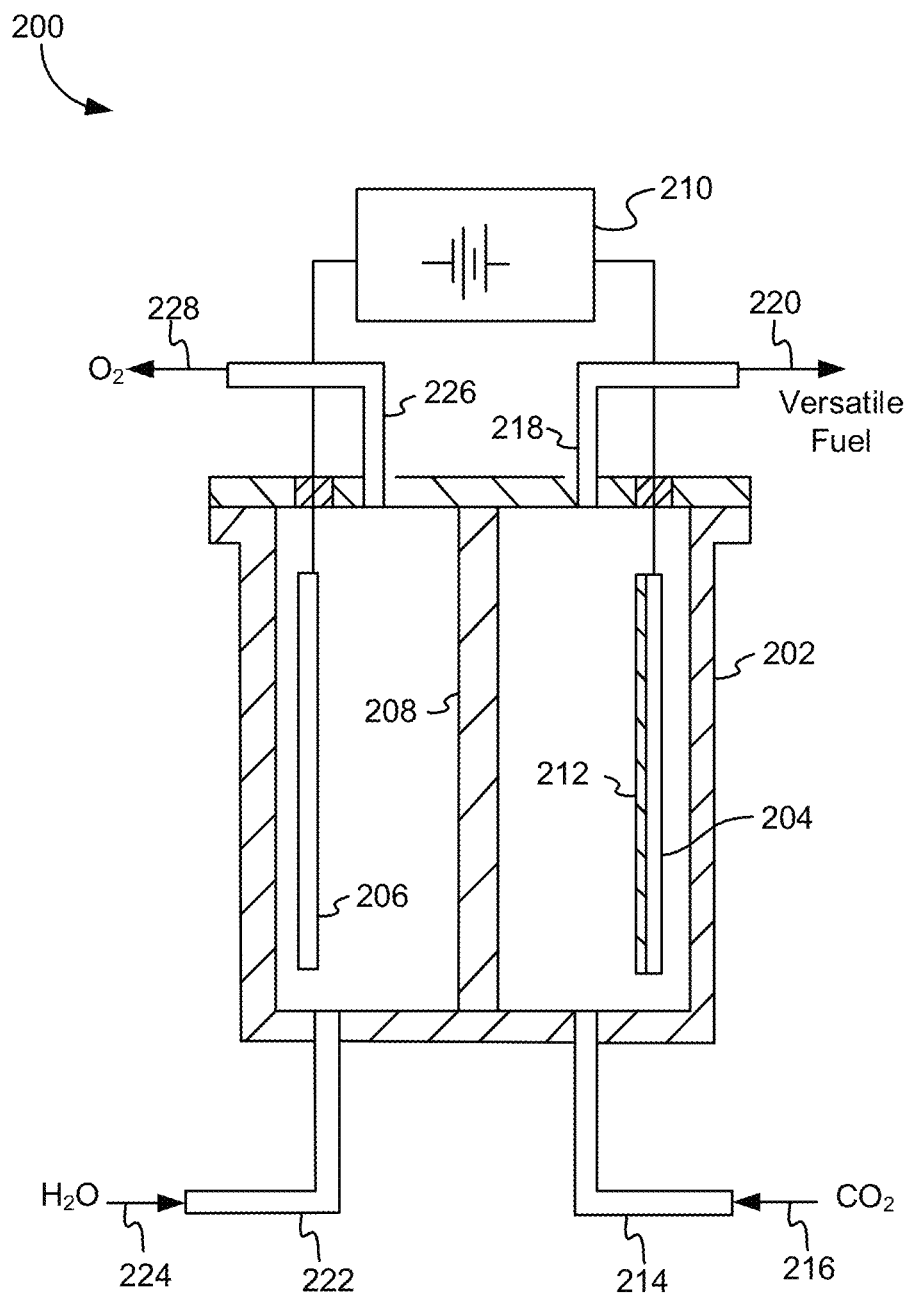
FIG. 2 is an exemplary apparatus, according to one aspect of the presently disclosed inventive concepts.

In preferred approaches, the prepared cathode (e.g., coupled to the dilute Cu-based alloy catalyst) is placed in an electrolyzer cell wherein the electrolyzer comprises a vessel, the cathode, a membrane, and an anode. The cathode and the anode are positioned in the vessel and spaced apart from one another. The vessel comprises a membrane positioned between the cathode and the anode. Various other components may be present in the vessel and/or in the electrolyzer system as would become apparent to one having ordinary skill in the art in view of the present disclosure. An exemplary system comprising the electrolyzer, the alloy coupled to the cathode, the anode, etc., is shown in FIG. 2. In some approaches, various tests may be performed for confirming an amount of energy required to produce the desired results (e.g., methane, ethylene, other hydrocarbons, etc.).

In various aspects, the product comprising the dilute alloy catalyst may optionally be thermally processed. The product comprising the dilute alloy catalyst may be sintered and/or annealed in a manner that would become apparent to one having ordinary skill in the art upon reading the present disclosure. For example, in one approach, a product comprising the dilute alloy formed by 3D printing using a support structure may be thermally processed by heating the product to at least 500° C. for burning out any polymer material (e.g., any carbon material) and leaving the printed structure including the catalyst.

FIG. 2 is an exemplary apparatus comprising the dilute Cu-based catalyst, in accordance with one embodiment. As an option, the present apparatus 200 may be implemented in conjunction with features from any other embodiment listed herein, such as those described with reference to the other FIGS. Of course, however, such apparatus 200 and others presented herein may be used in various applications and/or in permutations which may or may not be specifically described in the illustrative embodiments listed herein. Further, the apparatus 200 presented herein may be used in any desired environment.

The reactor vessel 202 houses the cathode electrode 204 and anode electrode 206. An electrolyzer membrane 208 separates the anode electrode area and the cathode electrode area of the reactor vessel 202. The cathode electrode 204 is coated with the dilute Cu-based alloy catalyst 212 (e.g., formed by the various aspects described herein). An inlet 214 to the reactor vessel 202 provides the introduction of $CO_2$ 216 into the reactor vessel 202. An outlet 218 from the reactor vessel 202 enables the withdrawal of versatile fuels 220 from the reactor vessel 202. An inlet 222 to the reactor vessel 202 provides the introduction of $H_2O$ 224 into the reactor vessel 202. An outlet 226 from the reactor vessel 202 enables the withdrawal of $O_2$ 228 from the reactor vessel 202.

The following experimental details are provided by way of example only, and should not be deemed limiting.

EXPERIMENTAL

The computational framework adopted to investigate the reduction reactivity of copper alloys utilizes a recently developed approach that hybridizes Density Functional Theory (DFT) simulations with the Effective Screening Medium (ESM) method and an implicit solvation scheme referred to as the Reference Interaction Site Method (RISM). The application of the ESM-RISM approach has been applied to investigate trends in CO binding and CO coupling activity on copper. These trends accounted for explicit control of the applied potential and pH within a grand-canonical ensemble mimicking the mechanics of the electrochemical interface.

Copper alloy electrodes along with the adsorbates were described within a DFT level simulation cell. The RISM-based implicit solvation scheme was used to create proportionate mixtures of water molecules and electrolyte ions at 300K to simulate 1 M KOH electrolyte solutions. The atomic charge and ion-solvent interactions were described using the optimized potentials for liquid simulations all-atoms (OPLS-AA) force field. Solvent interactions were described using a modified transferable 5-point intermolecular potential (TIPSP) force field. The RISM calculations adopted the Kovalenko and Hirata closure equation using a cutoff of 300 Ry for computing the liquid interaction site spatial distributions. A Lennard-Jones (LJ) potential was employed to describe the interactions between the explicit copper and alloy atoms in the DFT simulation cell and the classical electrolyte. The LJ parameters employed in this work are reported in the table of FIG. 3. The LJ parameters for copper were trained using ab initio molecular dynamics simulation to allow reasonable reproduction of the ESM-RISM interfacial water structure on a Cu (100) surface. The CO—CO coupling and CO hydrogenation reactivity simulations were conducted by fixing the Fermi energy of the system in the explicit quantum-mechanical region. The net charge introduced into this region was balanced by the RISM based electrolyte ions allowing performance of the simulations within a grand canonical ensemble. The potentials were reported relative to a standard hydrogen electrode (V-SHE) value of $\varphi_{SHE} = -5.31$ V which was computed relative to the inner potential of a 1 M HCl solution over a Cu (100) surface.

The DFT calculations were conducted using non-local BEEF-vdW exchange-correlation functionals to describe the electronic interactions. Ultrasoft pseudopotentials sourced from the GBRV pseudopotential library were implemented for core-valence treatment. The kinetic energy and charge density were truncated at 36 and 360 Ry, respectively. The self-consistent electronic convergence limit was set to $1\times10^{-5}$ eV while the ionic convergence limit was set to 0.02 eV $\square^{-1}$ for the unconstrained atoms. A 4×4 periodic, asymmetric Cu (100) surface slab consisting of 3 layers was constructed. One copper atom from the surface layer was replaced by a secondary alloying element to construct a dilute copper alloy electrode with a surface alloy concentration of 6.25%. In this work, 10 alloy candidates were considered: Ag, Au, Al, B, Ga, In, Pb, Pd, Pt and Sn. A 25 $\square$ vacuum region was included to exclude interaction between periodic slab models. The bottom two layers of the slab were frozen to imitate the bulk arrangement while the top two layers (and the absorbed species) were relaxed until convergence was achieved. The Brillouin zones of the surface cells were sampled using unshifted 4×4×1 Monkhorst-Pack grids. The Fermi level was smeared using the Methfessel-Paxton scheme with a Gaussian width ($\sigma$) of 0.2 eV for all surface cells. All calculations were performed using plane-wave DFT as implemented in the PW scf code as part of the Quantum Espresso software suite (Quantum ESPRESSO Foundation, c/o DBS Accountants, Unit 6, Glassworld, Cambridge Road Industrial Estate, Milton, Cambridge, CB24 6AZ (UK)).

Results: Thermodynamic Stability of Cu Alloys Under Operating Conditions

Figure 4B:
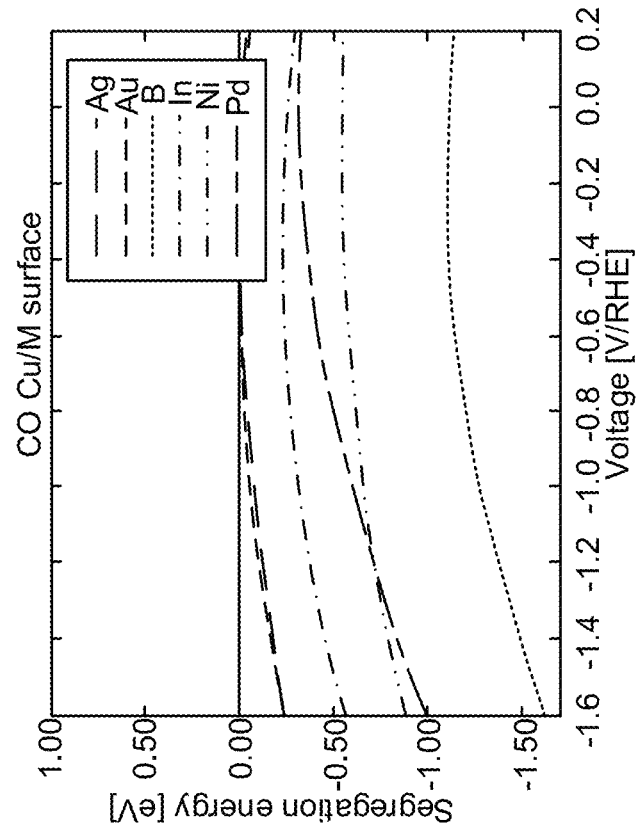
FIG. 4B is a plot of alloys with adsorbed CO under various applied potentials in 1 M KOH, according to one aspect of the presently disclosed inventive concepts.
Figure 4A:
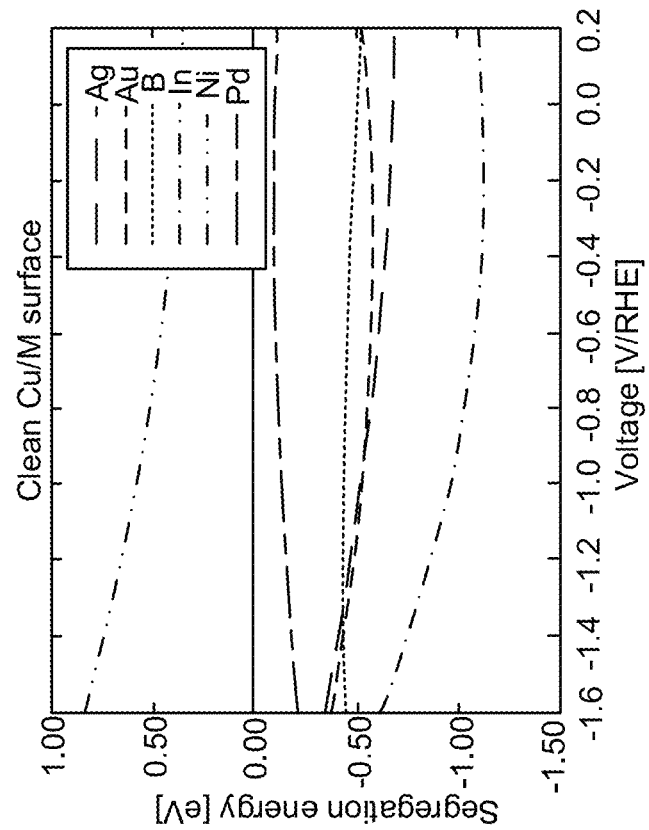
FIG. 4A is a plot of the stability of the Cu alloys, according to one aspect of the presently disclosed inventive concepts.

FIG. 4A is a plot of the stability of the Cu alloys. FIG. 4B is a plot of alloys with adsorbed CO under various applied potentials in 1 M KOH.

Results: Activity and Selectivity of Cu Alloy Under Operating Conditions

Figure 5A:
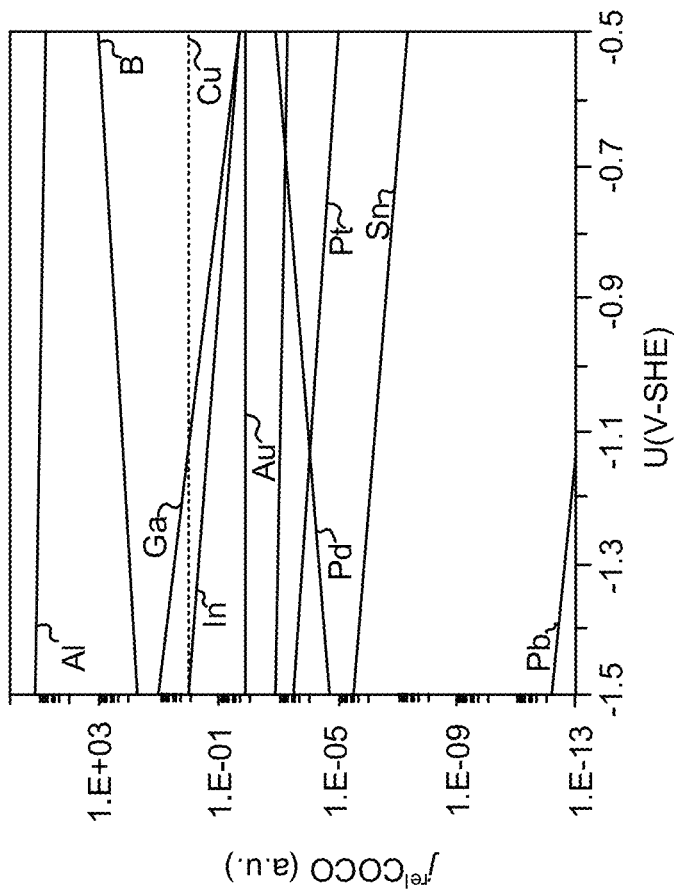
FIG. 5A is a plot of the potential dependent reaction energy ($\Delta E_{COCO}$ in eV) for CO dimerization on various alloys, according to one aspect of the presently disclosed inventive concepts.
Figure 5B:
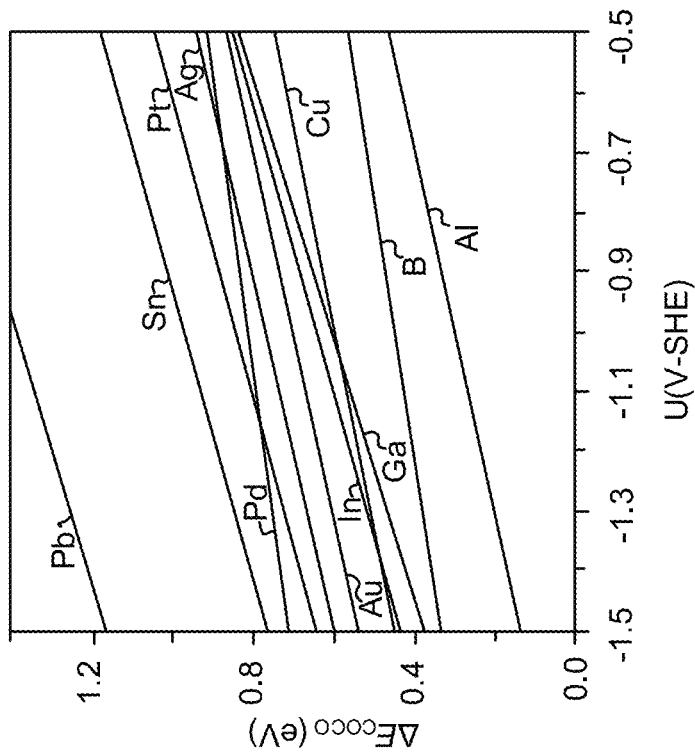
FIG. 5B is a plot of the theoretical current density ($j^{rel}$) of Cu alloys (CuX) relative to Cu, according to one aspect of the presently disclosed inventive concepts.

FIG. 5A shows the potential dependent reaction energies for CO coupling on Cu (100) alloy electrodes in 1 M KOH electrolyte solution evaluated using the described hybrid ESM-RISM framework. The CO molecules are adsorbed at the bridge site between the copper and the alloy atom while the dimerized OCCO form occurs over the neighboring hollow site. Under increasing cathodic potentials, the reaction energy for CO coupling lowers as reported in FIG. 5A and critically depends on the type of alloy involved in the dimerization. Relative to pure Cu (100) electrode, CuAl (100), CuB (100), and CuGa (100) exhibit lower thermodynamic reaction energies indicating higher activity toward CO coupling. In contrast, CuSn (100), CuPt (100) and CuPd (100) had a higher energy penalty to dimerize CO relative to pure Cu (100). CuAg (100) and CuAu (100) showed similar activity to pure Cu (100). FIG. 5B provides order of magnitude change in the theoretical current density toward CO coupling on Cu alloys relative to pure Cu. Assuming that the order of the prefactors is similar, the simulations predict a six-fold increase in CO coupling activity on CuAl compared to a pure Cu electrode. The results indicate that the CO coupling activity is critically linked to the type of alloy active site under electrochemical reducing conditions. Thus, in order to optimize the reaction efficiency of $C_2+$ products in a predictable way, a fundamental understanding of the alloy's contribution in modulating key reactions and its impacts on the electronic state of the electrocatalyst is key for a successful rational catalyst design venture. FIG. 5B is a plot of the theoretical current density ($j^{rel}$) of Cu alloys (CuX) relative to Cu. Energetics were computed using an electrolyte solution of 1 M KOH solution. The dashed line denotes values for pure, undoped Cu (100). Here, $\Delta E_{COCO}(U) = E_{OCCO}(U) - E_{CO+CO}(U)$ and $j^{rel} = j_{CuX}(U)/j_{Cu}(U)$ where, $j(U) \propto e^{-\Delta E_{COCO}(U)/RT}$.

Figure 6:
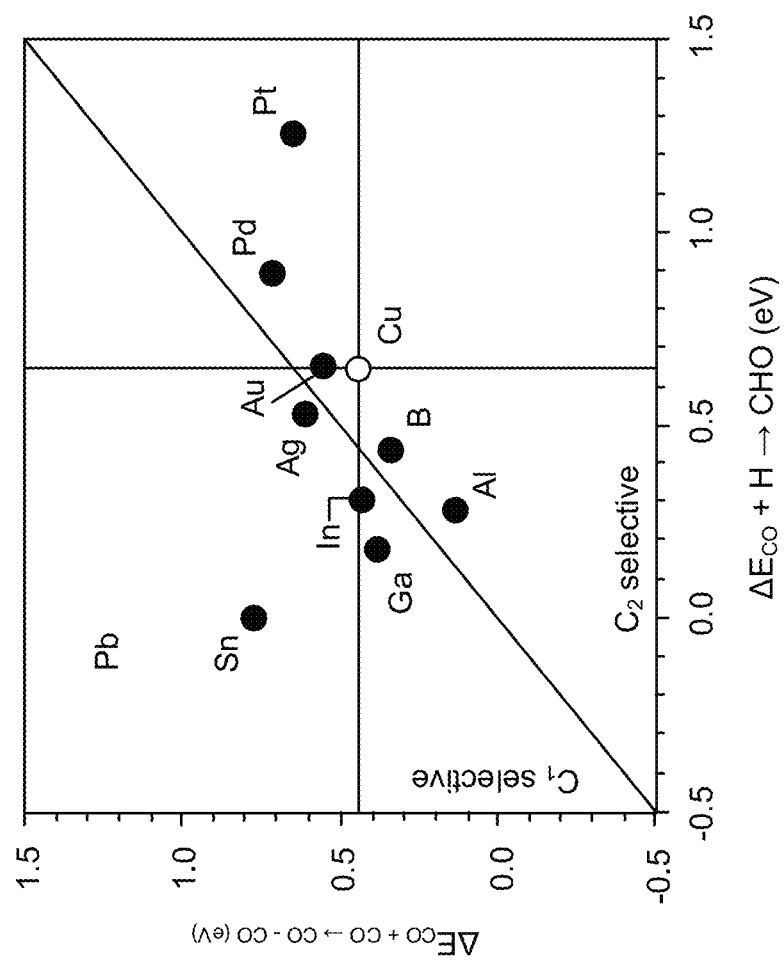
FIG. 6 is a parity plot comparing the reaction energy of key rate limiting steps of CO coupling and CO hydrogenation on the Cu alloy, according to one aspect of the presently disclosed inventive concepts.

FIG. 6 is a parity plot comparing the reaction energy of key rate limiting steps of CO coupling and CO hydrogenation on the Cu alloy. Reaction energetics reported in FIG. 6 have been computed under an applied potential of −1.5 V-SHE in 1 M KOH solution. FIG. 6 demonstrates CO coupling and CO hydrogenation on all considered copper alloy candidates in 1 M KOH solution. Lower energy values correspond to more favorable reaction energetics. Data points lying close to the parity line (the solid diagonal in FIG. 6) indicate that the Cu alloys have a similar thermodynamic driving force to couple and hydrogenate CO and do not show a strong preference toward one reaction type. Copper alloys that lie below the parity line are energetically preferential toward coupling CO while those above the parity line prefer CO hydrogenation. Based on the selectivity map in FIG. 6, CuAl and CuB show a stronger preference toward coupling CO signifying that they likely can enhance not only the reactivity but also the selectivity of $C_2$ intermediates during electrochemical reducing conditions. CuPd and CuPt show a higher penalty to either coupling and hydrogenating CO relative to pure Cu indicating that alloying copper with late transition metals retards the reactivity and selectivity efficiency toward CO reduction. This trend can be rationalized based on a two-fold role of the surface alloy that tunes the adsorption of CO by concomitantly altering the electronic properties of the electrocatalyst.

As shown in FIG. 6, decreasing values denote favorable energetics. Cu alloys in the $C_2$ selective portion enhance CO coupling relative to Cu and Cu alloys in the $C_1$ selective portion enhance CO hydrogenation relative to pure Cu. Alloys in the upper right portion have unfavorable energetics relative to pure Cu. The solid diagonal line is the parity line.

Figure 7:
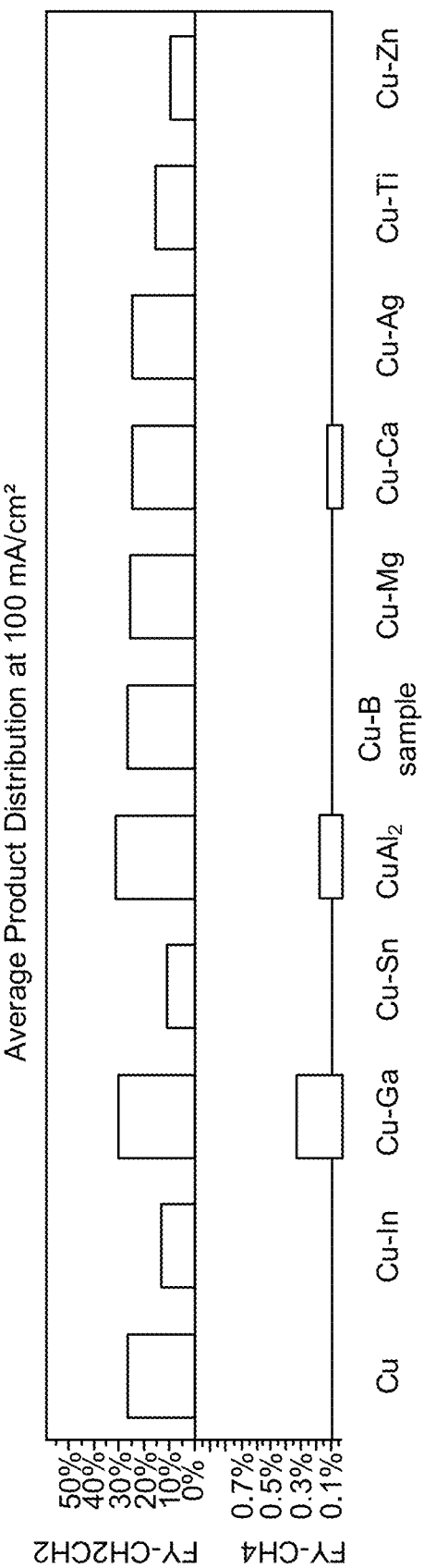
FIG. 7 is a chart of the faradaic efficiencies toward $C_2H_4$ and $CH_4$ for Cu alloys in gas diffusion electrode (GDE) setup at 100 mA/$cm^2$ in 0.25 M KOH solutions, according to one aspect of the presently disclosed inventive concepts.

Results: Experimental Validation of Activity-Selectivity Trends for $CO_2$ Reduction Across Cu Alloys in 0.25 M KOH Solution FIG. 7 is a chart of the faradaic efficiencies toward $C_2H_4$ and $CH_4$ for Cu alloys in gas diffusion electrode (GDE) setup at 100 mA/cm$^2$ in 0.25 M KOH solutions measured for different dilute alloy catalysts as described above. Changing only the nature of the dilute alloy component while leaving the concentration constant at 5 atomic can completely change the product distribution. As predicted by the rational catalyst design platform described above, CuAl (about 5 atomic % Al), CuB (about 5 atomic % B), and CuGa (about 5 atomic % Ga) have a higher Faradaic yield for ethylene.

Figure 8:
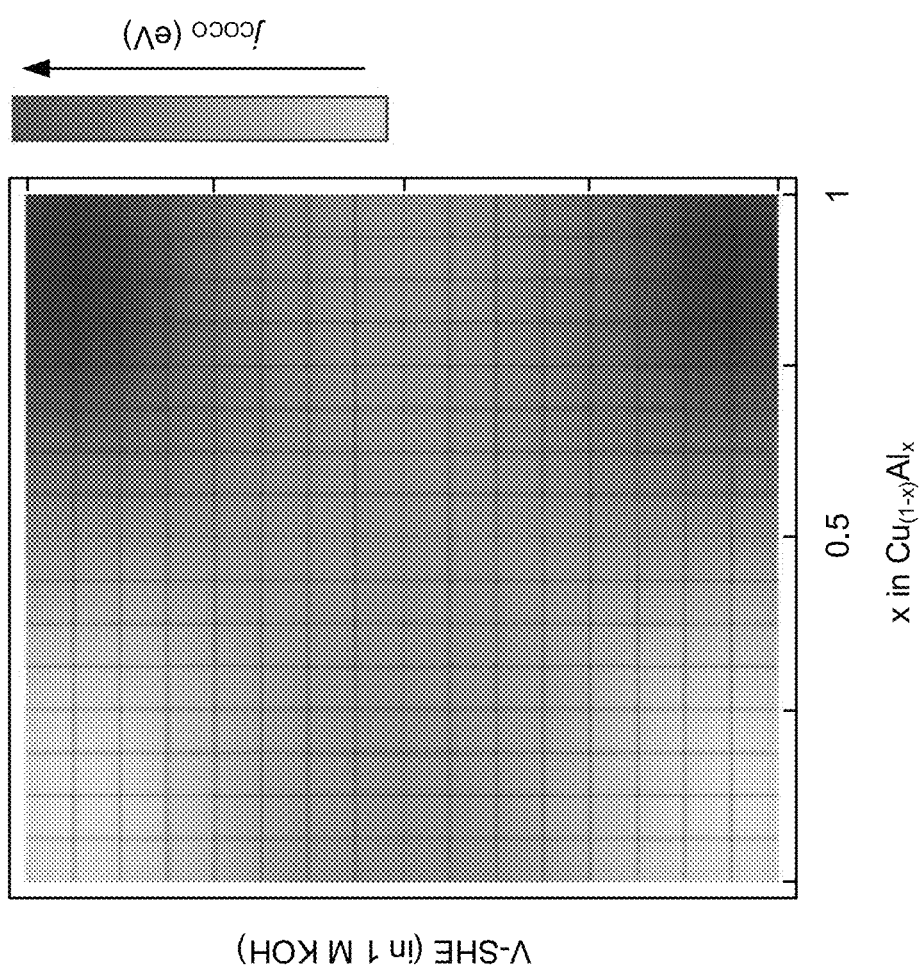
FIG. 8 is a schematic illustration of a contour plot of alloying composition dependent theoretical current density ($j_{COCO}$) of $Cu_{(1-x)}Al_x$ (0<x<1, where x=fractional composition), according to one aspect of the presently disclosed inventive concepts.

FIG. 8 is a schematic illustration of a contour plot of alloying composition dependent theoretical current density ($j_{COCO}$) of $Cu_{(1-x)}Al_x$ (0<x<1, where x=fractional composition). Energetics were computed using an electrolyte solution of 1 M KOH solution. Further development using the contour plot may include tuning the activity-selectivity trends using composition control.

A comparison of experimental electrochemical rates for $CO_2$-to-CO reduction and hydrogen evolution with theoretically computed binding energies (e.g., values in eV computed at −0.84 V-SHE (Standard Hydrogen Electrode) in 1 M KOH) reveals that alloys that weakly bind CO and H help promote $CO_2$-to-CO reduction and suppress $H_2$ evolution. The promoter metal in the Cu alloy reconfigures the relative binding preference of CO and H on the electrocatalyst surface invoking a competition for surface sites between CO and H and altering the relative rates of $CO_2$ to CO conversion and hydrogen evolution reaction (HER). For instance, Ag weakly binds CO and H and predominantly converts $CO_2$ to CO, while being a poor HER catalyst. The use of CuAg serves to enhance $CO_2$ to CO relative to pure Cu and suppresses HER relative to pure Cu by further weakening the binding of CO and H.

Strong CO binding on late transition metal alloys (CuPd, CuNi, CuPt) lead to poorer C1/C2 reduction selectivity relative to Cu. CuAg, and CuAu are likely to improve reactivity and selectivity of CO reduction than pure Cu. The tightly bound CO on these late transition metal Cu alloys has a lower thermodynamic incentive to dimerize (CO+CO→CO-CO) and hydrogenate (CO+H→CHO) than pure Cu. By contrast, CuAg, CuAu and CuAl improve reactivity and selectivity of CO reduction compared to pure Cu. Based on the theoretical estimates, CuAl is predicted to be a viable candidate with enhanced $CO_2$ conversion to ethylene due to its higher reactivity to dimerize CO than pure Cu. Relative to CuPd, CuAl has a higher reactivity for CO conversion (~0.7 eV).

Calculated reaction energies of CO dimerization and CO hydrogenation on various Cu based dilute alloy catalyst results demonstrate that the relative stabilities of the rate limiting reaction intermediates on dilute alloy catalysts are no longer closely coupled, thus breaking the scaling relationships that limit the ability to improve catalyst reactivity and selectivity by changing the morphology or composition of traditional metal and metal alloy catalysts. Specifically, dilute alloying with aluminum makes CO dimerization considerably more exothermic, from ~0.5 eV for pure Cu to −1.1 eV for CuAl.

The following dilute Cu-based alloys were tested: CuAl, CuMg, CuCa, CuTi, CuB, CuSn, CuAg, CuIn, CuGa, and CuZn. The minority component (e.g., the non-copper component) was present in the dilute alloy in a concentration of 5 atomic percent. Among these, CuB, CuAl, and CuGa outperformed pure Cu in terms of ethylene selectivity which was in excellent agreement with the theoretical predictions and simulations. All of the tested alloys had 5 atomic percent of the minority alloy component present in the alloy with the exception of the CuAl system where the $CuAl_2$ sample was tested. The $CuAl_2$ sample was expected to lose Al due to leaching in the high pH test environment. In general, the minority alloy component concentration in the dilute alloy catalyst technology should be within 1 atomic percent and 10 atomic percent to warrant that the dilute alloy minority component concentration remains homogeneously dispersed, which for surface atoms requires less than 10 atomic percent because their coordination number of 9. The testing was performed for dilute alloys having the minority component present in a concentration of 5 atomic percent where the minority components within the dilute alloy are far enough away from the upper concentration limit of 10 atomic percent while having a high enough concentration of the minority component to significantly affect the reactivity and selectivity of the dilute alloy catalyst.

In Use

The dilute Cu-based alloy catalyst as described in detail herein may be used as a catalyst for electrochemical carbon dioxide reduction for Power-to-Fuel conversion and long-term (e.g., seasonal) electric energy storage of intermittent, renewable electric energy. The dilute alloy would be advantageous for generating a broad commercial impact to chemical and renewable energy industries.

Oher applications of the dilute Cu-based alloy catalyst may include hydrocarbon activation, for example, electrochemical partial oxidation of methane to methanol or formaldehyde, or electrochemical nitrogen fixation.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A product, the product comprising:
a dilute alloy catalyst for carbon dioxide reduction, the catalyst having a majority component and at least one minority component; and a cathode, the catalyst being coupled to the cathode,
wherein the majority component of the catalyst is present in a concentration of greater than 90 atomic percent of the catalyst,
wherein the majority component is copper,
wherein each minority component of the catalyst is selected from the group consisting of: a transition metal, a main group metal, a lanthanide, and a semi-metal.

2. The product as recited in claim 1, wherein the catalyst is porous, wherein at least 50% of the catalyst by volume is void space.

3. The product as recited in claim 1, wherein the at least one minority component includes aluminum in a concentration of 0.1 to less than 10 atomic percent of the catalyst.

4. The product as recited in claim 1, wherein the at least one minority component includes gallium in a concentration of 0.1 to less than 10 atomic percent of the catalyst.

5. The product as recited in claim 1, wherein the at least one minority component is selected from the group consisting of: gold and silver.

6. The product as recited in claim 1, wherein the at least one minority component includes an element selected from the group consisting of: titanium, calcium, and magnesium.

7. The product as recited in claim 1, wherein the at least one minority component includes boron.

8. The product as recited in claim 1, wherein the at least one minority component is present in a concentration of less than 6 atomic percent of the catalyst.

9. The product as recited in claim 1, wherein the catalyst is configured to catalyze the reduction of carbon dioxide to methane.

10. The product as recited in claim 1, wherein the catalyst is configured to catalyze the reduction of carbon dioxide to ethylene.

11. The product as recited in claim 1, wherein the catalyst is a single phase alloy of the majority component and the at least one minority component.

12. The product as recited in claim 11, wherein the catalyst includes ball milled single phase particles of the majority component and the at least one minority component.

13. The product as recited in claim 1, comprising a cathode, the catalyst being coupled to the cathode.

14. The product as recited in claim 13, comprising a vessel and an anode, the cathode and the anode being positioned in the vessel and spaced apart from one another, the vessel having a membrane positioned between the cathode and the anode.

15. A method for forming the product of claim 1, the method comprising: forming the catalyst on the cathode.

16. The method as recited in claim 15, wherein forming the catalyst on the cathode includes applying the catalyst directly to the cathode.

17. The method as recited in claim 16, wherein applying the catalyst directly to the cathode includes magnetron sputtering.

18. The method as recited in claim 16, wherein applying the catalyst directly to the cathode includes e-beam evaporation.

19. The method as recited in claim 16, wherein applying the catalyst directly to the cathode includes electrodeposition.

20. The method as recited in claim 15, wherein the catalyst is integrated into an ink, wherein forming the catalyst on the cathode includes ink jetting.

21. The method as recited in claim 15, comprising positioning the cathode in a vessel and positioning an anode in the vessel, the vessel having a membrane positioned between the cathode and anode.

* * * * *